United States Patent
Ku et al.

(10) Patent No.: US 9,459,279 B2
(45) Date of Patent: Oct. 4, 2016

(54) ELECTRICAL TESTING MACHINE

(71) Applicant: MPI CORPORATION, Zhubei (TW)

(72) Inventors: Wei-Cheng Ku, Zhubei (TW);
Shao-Wei Lu, Zhubei (TW);
Hung-Chih Sung, Zhubei (TW);
Chun-Nan Chen, Zhubei (TW)

(73) Assignee: MPI CORPORATION, Zhubei (TW)

( * ) Notice: Subject to any disclaimer, the term of this patent is extended or adjusted under 35 U.S.C. 154(b) by 127 days.

(21) Appl. No.: 14/557,043

(22) Filed: Dec. 1, 2014

(65) Prior Publication Data

US 2015/0204908 A1 Jul. 23, 2015

(30) Foreign Application Priority Data

Dec. 13, 2013 (TW) .............................. 102146115 A

(51) Int. Cl.
*G01R 31/00* (2006.01)
*G01R 1/04* (2006.01)
*G01R 31/28* (2006.01)
*G01R 1/073* (2006.01)

(52) U.S. Cl.
CPC ............. *G01R 1/04* (2013.01); *G01R 31/2887* (2013.01); *G01R 1/07392* (2013.01)

(58) Field of Classification Search
CPC .............. G01R 31/26; G01R 31/2642; G01R 31/2648; G01R 31/2831; G01R 31/31702; G01R 1/0491; G01R 31/265; G01R 31/318511; G01R 1/07307; G01R 1/07342; G01R 1/0408; G01R 1/0433; G01R 1/0483; G01R 1/07314; G01R 31/2886; G01R 1/06716; G01R 1/06733; G01R 1/06788; G01R 3/00; G01R 31/2808; G01R 31/2889; G01R 31/312

See application file for complete search history.

(56) References Cited

U.S. PATENT DOCUMENTS

| 4,651,405 A | 3/1987 | McMurtry | |
|---|---|---|---|
| 6,734,694 B2* | 5/2004 | Tauchi | G01R 31/2851 324/750.16 |
| 2011/0037492 A1* | 2/2011 | Seubert | G01R 1/0491 324/756.03 |
| 2015/0204908 A1 | 7/2015 | Ku et al. | |

FOREIGN PATENT DOCUMENTS

| TW | 201319769 | 5/2013 |
|---|---|---|
| TW | M453842 | 5/2013 |

* cited by examiner

*Primary Examiner* — Tung X Nguyen
(74) *Attorney, Agent, or Firm* — Lynette Wylie; Apex Juris, pllc

(57) ABSTRACT

An electrical testing machine includes a base having two parallel first rails, a platform provided on the base, a probe holder provided on the base and having a plurality of placement locations, a support provided between the first rails and having a second rail thereon, a test arm provided on the second rail and above the platform, a receiving seat provided on the test arm, and a plurality of probe sets, wherein one of the probe sets is engaged on the receiving seat, while the others are respectively provided on the placement locations. The support is movable relative to the base and the platform. The test arm is movable along with the support, and is also movable relative to the support. The receiving seat is movable or rotatable relative to the test arm. The probe set engaged on the receiving seat is movable along with the receiving seat.

9 Claims, 4 Drawing Sheets

ELECTRICAL TESTING MACHINE

BACKGROUND OF THE INVENTION

1. Technical Field

The present invention relates generally to electrical testing, and more particularly to an electrical testing machine.

2. Description of Related Art

For a manufacturer of electronic products, a testing system capable of checking electrical connections between each precision electronic component is usually required in different steps of the manufacturing process, which helps to ensure the quality of products.

However, a conventional electrical testing system can only test products with one specific testing specification at once, and has no capacity to handle tasks of multiple testing specifications. In addition, to test products with different specifications, it has to manually disassemble and replace corresponding probe sets, which is time-consuming and laborious.

BRIEF SUMMARY OF THE INVENTION

In view of the above, the primary objective of the present invention is to provide an electrical testing machine, which is able to do electrical testing on objects with different specifications.

The present invention provides an electrical testing machine used to do an electrical testing on a tested portion of a DUT. The electrical testing machine includes a base, a platform, a probe holder, a support, a test arm, a receiving seat, and a plurality of probe sets. The base has two parallel first rails thereon. The platform is provided on the base for the DUT to be placed thereon. The probe holder is provided on the base, and has a plurality of placement locations thereon. The support is provided on the first rails, wherein the support is movable relative to the base and the platform along the first rails, and has a second rail provided thereon. The test arm is provided on the second rail and above the platform, wherein the test arm is movable along with the support, and is also movable relative to the support along the second rail. The receiving seat is provided on the test arm to be moved along with the test arm, wherein the receiving seat is also movable or rotatable relative to the test arm. One of the probe sets is detachably provided on the receiving seat, while other probe sets are detachably provided on the placement locations of the probe holder respectively, wherein the probe set provided on the receiving seat is movable along with the receiving seat to contact with the tested portion of the DUT placed on the platform to do the electrical testing.

Whereby, with the aforementioned design, the electrical testing machine can be used in testing tasks of different specifications.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
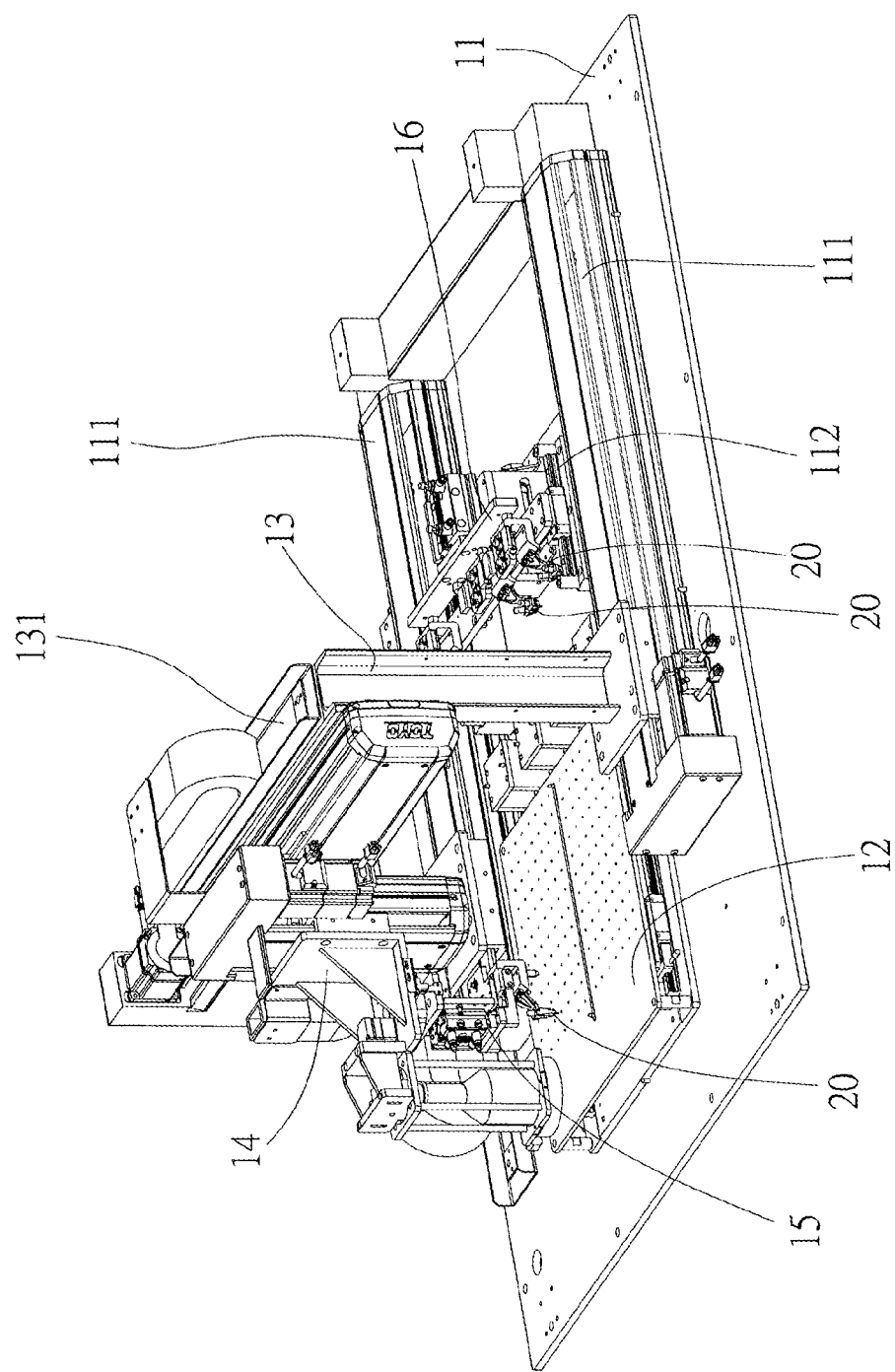
FIG. 1 is a perspective view of the electrical testing machine of a preferred embodiment of the present invention.

As shown in FIG. 1, an electrical testing machine 10 of the preferred embodiment of the present invention is used to do electrical testing on a DUT (device under test), which has a plurality of tested portions with different measuring distances (not shown) thereon. The electrical testing machine includes a base 11, a platform 12, a support 13, a test arm 14, a receiving seat 15, and a plurality of probe sets 20.

The base 11 has two parallel first rails 111 and two parallel third rails 112 thereon, wherein a moving direction provided by the first rails 111 is parallel to a moving direction provided by the third rails 112.

The platform 12 is used for placing the DUT thereon, and is provided on the base 11 between the first rails 111.

The support 13 has two vertical sections connected together with a horizontal section, and therefore is in an approximate "n" shape. The vertical sections are respectively provided on the first rails 111, whereby the support 13 can be driven along the first rails 111 to be moved relative to the base 11 and the platform 12. In addition, a second rail 131 is provided on the horizontal section of the support 13, wherein a moving direction provided by the second rail 131 is perpendicular to that provided by the first rails 111.

Figure 2:
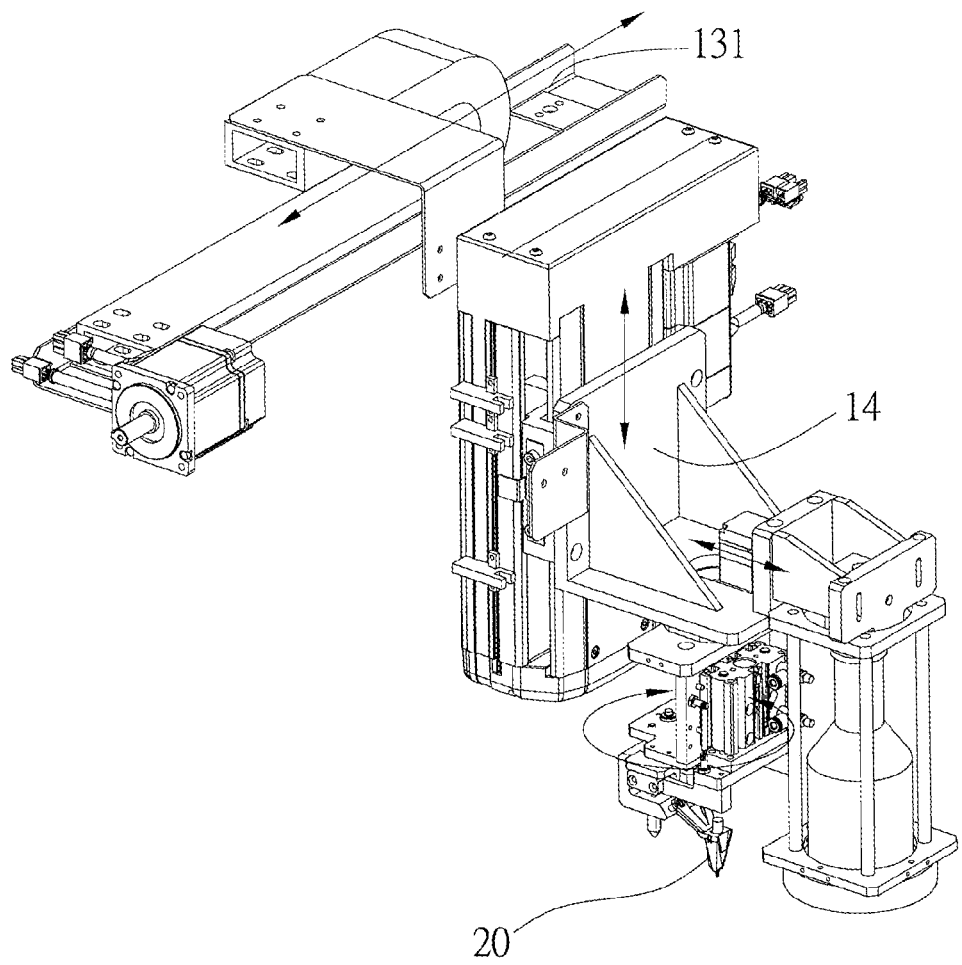
FIG. 2 is a perspective view of the preferred embodiment of the present invention, showing the structure of the test arm.

As shown in FIG. 2, the test arm 14 is provided on the second rail 131, and hence is above the platform 12. The test arm 14 can be moved together with the support 13, and can be also moved relative to the support 13 along the second rail 111.

The receiving seat 15 is provided on the test arm 14 to be moved along with the test arm 14, wherein the receiving seat 15 can also be driven to rotate or move relative to the test arm 14.

Figure 3:
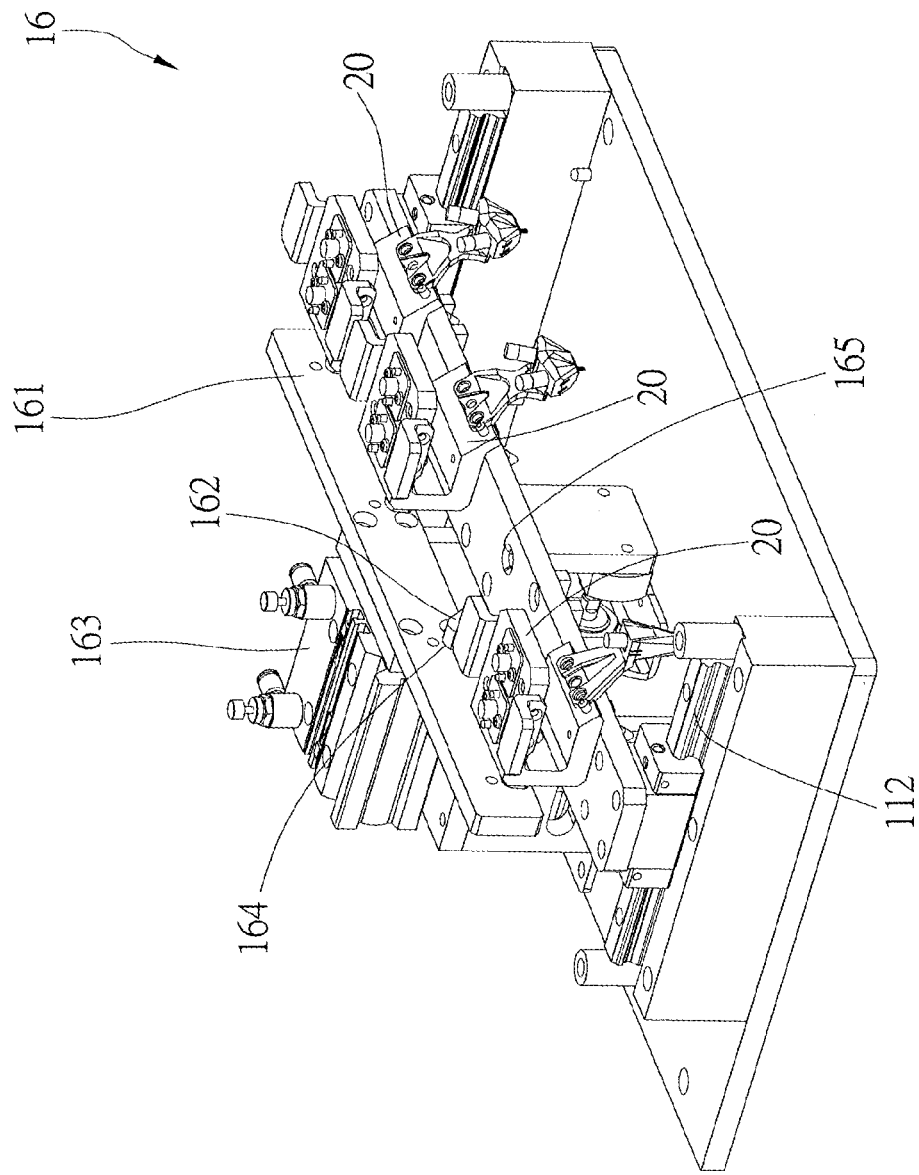
FIG. 3 is a perspective view of the probe holder of the preferred embodiment of the present invention.

The probe holder 16 is provided on the base 11 at a different location from the platform 12. As shown in FIG. 3, the probe holder 16 has a main body 161, a plurality of positioning posts 162, and a positioning driver 163. The main body 161 is provided on the third rails 114 to be moved along the third rails 114. The main body 161 has a plurality of placement locations, each of which respectively corresponds to a first perforation 164 and an inserting hole 165 which are provided on the main body 161. The positioning driver 163 is connected to the main body 161 and the positioning posts 162, and is able to drive the main body 161 to make the positioning posts 162 respectively engage into or disengage with the first perforations 164.

Figure 4:
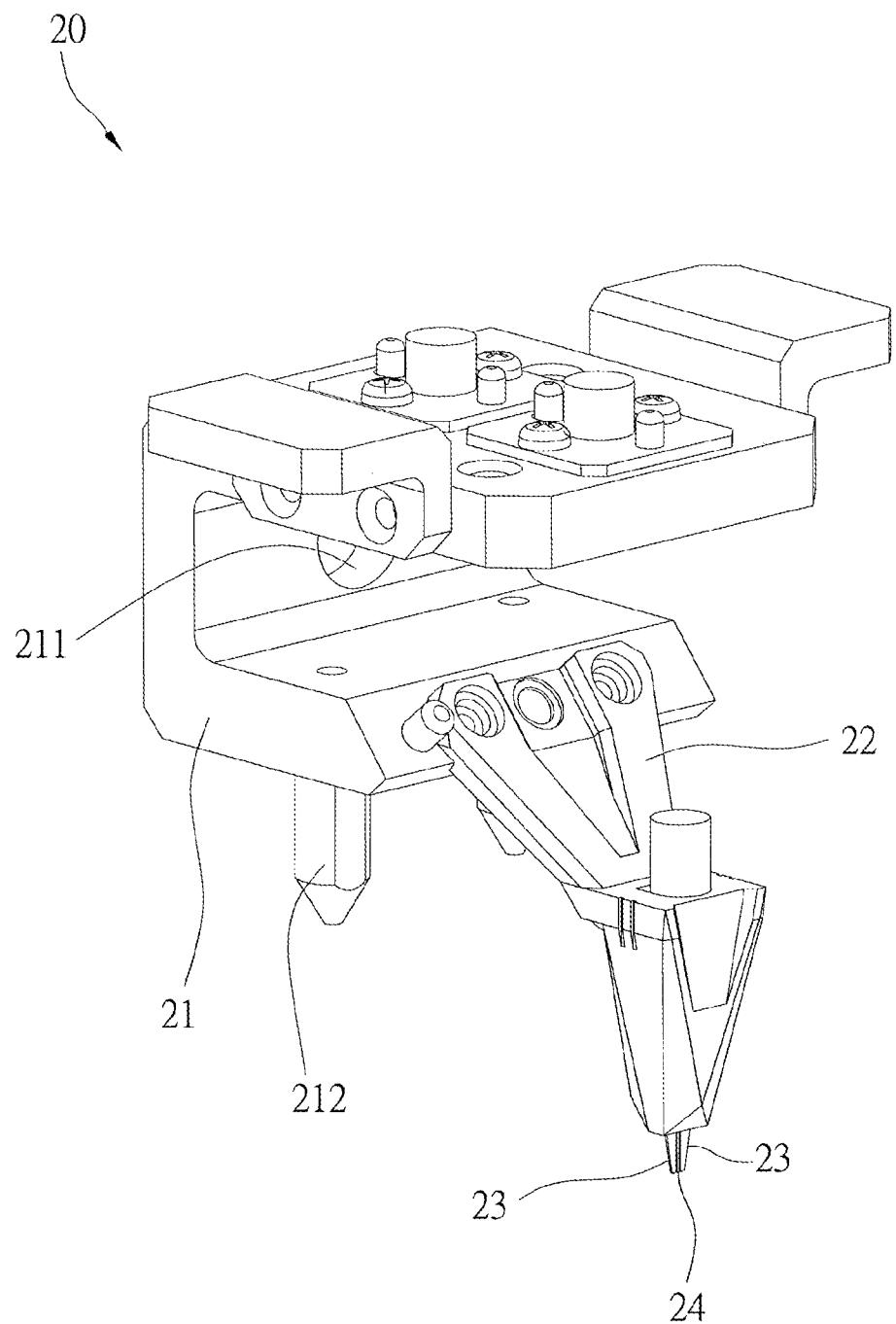
FIG. 4 is a perspective view of the probe set of the preferred embodiment of the present invention.

One of the probe sets 20 is detachably provided on the receiving seat 15, while other probe sets 20 are detachably provided on the placement locations of the probe holder 16 respectively. As shown in FIG. 4, each of the probe sets in the preferred embodiment of the present invention respectively has a frame 21, a case 22, and three probes 23, 24. The frame 21 has a top section, a side section, and a bottom section to form a "c" shape, wherein a second perforation 211 is provided on the side section, while a pin 212 is provided under the bottom section. Take one of the probe sets 20 for explanation, when it is placed on one of the placement locations of the probe holder 16, the frame 21 contacts the main body 161 with the pin 212 going through one of the inserting holes 165, and the second perforation 211 directly aligns one of the first perforations 164, so that the corresponding positioning post 162 can go through the second perforation 211. The case 22 is firmly provided on the frame 21, and the probes 23, 24 are provided in the case 22 with their tips extending out of the case 22. In addition, the probes 23, 24 includes two ground probes 23 and a signal probe 24 which are defined according to the transmission direction of signals while testing, wherein the signal probe 24 is located between the ground probes 23. It is worth mentioning that, a distance between the signal probe 24 and each of the ground probes 23 for each of the probe sets 20 is different from each other, and therefore the electrical testing machine 10 has wider compatibility than the conventional types. Furthermore, the probe set 20 provided on the receiving seat 15 can be moved or rotated along with the receiving seat 15.

Whereby, for any probe set 20 positioned on one of the placement locations of the probe holder 16, the positioning driver 163 can be controlled to move its main body 161 to make the corresponding positioning post 162 extend through the corresponding first perforation 164 and the second perforation 211. As a result, the probe set 20 can be firmly provided on the probe holder 16. When a tester intends to do electrical testing, according to the location and measuring distance of the tested portion of the DUT which is going to be tested, the support 13, the test arms 14, and the receiving seat 15 of the electrical testing machine 10 can be moved or rotated, and the positioning driver 163 can be controlled to move the main body 161 to make the positioning posts 162 exit the first perforations 164 and the second perforations 211. The probe set 20 corresponding to the measuring distance can be engaged to the receiving seat 18 in this way. After that, the probe set 20 is moved to a position above the tested portion ready for testing. The receiving seat 15 is then moved to bring the probe set 20 thereon downwardly to make the ground probes 23 and the signal probe 24 of the probe set 20 contact the tested portion of the DUT for doing the follow up electrical testing.

In addition, when the tester intends to do electrical testing on another tested portion with different measuring distance, the support 13, the test arms 14, and the receiving seat 15 of the electrical testing machine 10 is moved or rotated to make the pin 212 of the currently used probe set 20 go through one of the inserting hole 212 again. And then, the positioning driver 163 is controlled to move the main body 161 to make the positioning posts 162 extend through the first perforations 164 and the second perforations 211. Consequently, two perpendicular forces are provided to easily disengage the currently used probe set 20 with the receiving seat 18. The probe set 20 corresponding to the measuring distance of the tested portion which is going to be tested is then engaged to the receiving seat 18 with the aforementioned way for doing the follow up electrical testing.

In summary, with the aforementioned design of multiple probe sets 20, the electrical testing machine 10 has wider compatibility. Furthermore, the support 13, the test arm 14, and the receiving seat 15 can be moved or rotated to bring each of the probe sets 20 to different locations with different angles, and therefore no matter at what angle a tested portion is located, the electrical testing machine 10 provided in the present invention can always do electrical testing thereon.

It must be pointed out that the embodiments described above are only some preferred embodiments of the present invention. All equivalent structures which employ the concepts disclosed in this specification and the appended claims should fall within the scope of the present invention.

What is claimed is:

1. An electrical testing machine, which is used to do an electrical testing on a tested portion of a DUT, comprising:
   a base having two parallel first rails thereon;
   a platform provided on the base for the DUT to be placed thereon;
   a probe holder provided on the base, and having a plurality of placement locations thereon;
   a support provided on the first rails, wherein the support is movable relative to the base and the platform along the first rails, and has a second rail provided thereon;
   a test arm provided on the second rail and above the platform, wherein the test arm is movable along with the support, and is also movable relative to the support along the second rail;
   a receiving seat provided on the test arm to be moved along with the test arm, wherein the receiving seat is also movable or rotatable relative to the test arm; and
   a plurality of probe sets, wherein one of the probe sets is detachably provided on the receiving seat, while other probe sets are detachably provided on the placement locations of the probe holder respectively, wherein the probe set provided on the receiving seat is movable along with the receiving seat to contact with the tested portion of the DUT placed on the platform to do the electrical testing.

2. The electrical testing machine of claim 1, wherein each of the probe sets has at least two probes; a distance between the probes of each of the probe sets is different from each other.

3. The electrical testing machine of claim 1, wherein the probe holder further has a main body and a plurality of positioning posts; the placement locations are on the main body, and each of the placement locations respectively corresponds to a first perforation on the main body; each of the probe sets has a frame having a second perforation thereon; when any of the probe sets is provided on one of the placement locations of the probe holder, the frame contacts the main body, and the second perforation directly aligns the first perforation; the positioning posts respectively go through the corresponding first perforation and the corresponding second perforation; the positioning posts are movable relative to the main body to be engaged into or disengaged with the first perforations and the second perforations.

4. The electrical testing machine of claim 3, wherein the probe holder further has a positioning driver connected to the main body to move the main body and the positioning posts thereon together.

5. The electrical testing machine of claim 4, wherein the base further has a third rail thereof; the main body of the probe holder is provided on the third rail, and is drivable by the positioning driver to move along the third rail.

6. The electrical testing machine of claim 3, wherein the probe holder further has a positioning driver connected to the positioning posts to move the positioning posts at the same time.

7. The electrical testing machine of claim 1, wherein a moving direction provided by the first rails is perpendicular to a moving direction provided by the second rails.

8. The electrical testing machine of claim 5, wherein a moving direction provided by the first rails is parallel to a moving direction provided by the third rails.

9. The electrical testing machine of claim 1, wherein the probe holder has a plurality of inserting holes thereon, and each of the probe sets respectively has a pin; when any of the probe sets is provided on one of the placement locations of the probe holder, the pin is engaged with one of the inserting holes.

\* \* \* \* \*